United States Patent
Sim (10) Patent No.: US 8,890,101 B2
(45) Date of Patent: Nov. 18, 2014

(54) ELECTROMAGNETIC WAVE ABSORBING DEVICE

(75) Inventor: Dong-Uk Sim, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 13/996,679

(22) PCT Filed: Dec. 5, 2011

(86) PCT No.: PCT/KR2011/009359
§ 371 (c)(1), (2), (4) Date: Jun. 21, 2013

(87) PCT Pub. No.: WO2012/086943
PCT Pub. Date: Jun. 28, 2012

(65) Prior Publication Data
US 2013/0277579 A1    Oct. 24, 2013

(30) Foreign Application Priority Data

Dec. 23, 2010  (KR) .......... 10-2010-0133780

(51) Int. Cl.
| | | |
|---|---|---|
| *G21F 5/00* | (2006.01) | |
| *G21C 11/00* | (2006.01) | |
| *G21F 1/00* | (2006.01) | |
| *G21F 3/00* | (2006.01) | |
| *G21F 7/00* | (2006.01) | |
| *H05K 9/00* | (2006.01) | |

(52) U.S. Cl.
CPC ............... *G21F 3/00* (2013.01); *H05K 9/0003* (2013.01)
USPC ............ 250/515.1; 342/1; 342/2; 342/3; 342/4; 250/505.1

(58) Field of Classification Search
USPC ............ 250/515.1, 505.1, 250; 342/1-4
See application file for complete search history.

(56) References Cited

U.S. PATENT DOCUMENTS 4,972,191 A * 11/1990 Ishino et al. ............. 342/1

(Continued)

FOREIGN PATENT DOCUMENTS

| JP | 2005-183652 | 7/2005 |
| KR | 10-2007-0000483 | 1/2007 |
| KR | 10-2009-0118617 | 11/2009 |
| KR | 10-1042601 | 6/2011 |

OTHER PUBLICATIONS

International Search Report issued May 15, 2012 in corresponding International Patent Application No. PCT/KR2011/009359 (3 pages, in Korean).

(Continued)

*Primary Examiner* — Jack Berman
*Assistant Examiner* — Meenakshi Sahu
(74) *Attorney, Agent, or Firm* — NSIP Law (57) ABSTRACT

An electromagnetic wave absorbing device includes a ground layer formed of a metal conductor layer, a dielectric layer formed on the ground layer, and a unit cell pattern layer which is formed on the dielectric layer and made of resistive materials, wherein at least two electromagnetic bandgap-based unit cell patterns are periodically arranged on the unit cell pattern layer.

20 Claims, 7 Drawing Sheets

(56) References Cited

U.S. PATENT DOCUMENTS

| | | | |
|---|---|---|---|
| 5,510,792 A * | 4/1996 | Ono et al. | 342/4 |
| 6,538,596 B1 | 3/2003 | Gilbert | |
| 7,864,095 B2 | 1/2011 | Masuda et al. | |
| 8,013,777 B2 | 9/2011 | Sim et al. | |
| 2003/0211333 A1* | 11/2003 | Watanabe et al. | 428/422.8 |
| 2009/0284404 A1* | 11/2009 | Sim et al. | 342/1 |

OTHER PUBLICATIONS

D.J. Kern et al. "A genetic algorithm approach to the design of ultra-thin electromagnetic bandgap absorbers." Microwave and optical technology letters vol. 38.1 (Jul. 5, 2003): 61-64.

Q. Gao et al. "Application of metamaterials to ultra-thin radar-absorbing material design." Electronics Letters vol. 41. No. 17 (Aug. 18, 2005): 936-937.

* cited by examiner

ELECTROMAGNETIC WAVE ABSORBING DEVICE

CROSS-REFERENCE TO RELATED APPLICATION(S):

This application is a U.S. national stage application under 35 USC 371 of International Application No. PCT/KR2011/009359 filed on Dec. 5, 2011, which claims the benefit of Korean Application No. KR 10-2010-0133780 filed on Dec. 23, 2010, the entire disclosures of which are incorporated herein by reference for all purposes.

FIELD OF THE INVENTION

The present invention relates to an electromagnetic wave absorbing device, and, more particularly, to an electromagnetic wave absorbing device, which can be easily manufactured using a transparent material such as glass, which can easily control an absorption frequency band and absorption characteristics by adjusting parameters, and whose thickness can be easily adjusted.

BACKGROUND OF THE INVENTION

Recently, with the rapid advancement in IT (Information Technology) and the increase in humans' desire for communication, wireless communication devices, such as portable terminals and the like, have become necessities to modern people. However, the increased use of such portable terminals is making the influence of electromagnetic waves on human body into an important issue. To date, the influence of electromagnetic waves at a frequency band used by portable terminals on the human body is not yet clearly ascertained, but it has been reported that these electromagnetic waves may cause various diseases such as leukemia, brain tumor, headache, amblyopia, and when they are accumulated in the human body, brain wave disorders, men's reproductive dysfunction, and the like.

Further, there have been continuous reports of examples of undesired electromagnetic waves causing malfunctions between information communication devices. These examples are problems of EMI (Electromagnetic Interference) and EMC (Electromagnetic Compatibility) and steady research on EMI/EMC problems is under way across the world. Thus, many researches for effectively blocking electromagnetic waves to prevent the bad influences of the electromagnetic waves on the human body are being conducted.

An electromagnetic bandgap (EBG) as a technique of employing a periodic structure may be implemented by periodically arranging specifically designed unit cell patterns on a typical electric conductor at regular intervals. Since a tangential component of a magnetic field at a particular band on the surface of the EBG becomes zero, the EBG has the characteristic of preventing current from flowing through the surface. Such an EBG may be regarded as a magnetic conductor opposite to the typical electric conductor. The surface of the EBG is a high-impedance surface (HIS) in configuration of a circuit.

The frequency response characteristics of the EBG may be checked through a reflection phase which refers to a difference between the phases of an incident wave on the surface of the EBG and a reflected wave from the surface. The reflection phase of the EBG becomes zero at a resonant frequency corresponding to a high impedance surface and varies in a range from −180 degrees to 180 degrees in a frequency band around the resonant frequency. When the structural parameters of the EBG are adjusted, the reflection phase may vary.

In the structure of a typical EBG, a dielectric layer and an array layer of unit cell patterns other than a metal conductive ground plane constitute the typical structure of a frequency selective surface (FSS). FSS is a surface formed by artificially and periodically arranging specific unit cell patterns so as to selectively transmit or reflect desired frequencies. Therefore, an EBG not only completely blocks the progression of electromagnetic waves but also has the above-described unique physical characteristics, by virtue of providing a metal conductive ground plane for the characteristics of filtering of a specific frequency due to the FSS.

Conventional electromagnetic wave absorbers may be variously classified according to a type, material, absorption mechanism, and the like. To date, most electromagnetic wave absorbers have been made of materials formed to have absorption characteristics. Since such electromagnetic wave absorbers are generally developed after much trial and error, it is disadvantageous in that the manufacturing process thereof is complicated and it is highly difficult to adjust an absorption frequency band and absorption characteristics.

To address this problem, a plate-type resonant electromagnetic wave absorber such as a $\lambda/4$ wave absorber or a Salisbury screen has been proposed. Such a plate-type resonant electromagnetic wave absorber is composed of a resistive film, a dielectric spacer and a metal conductive ground plane. Therefore, it is advantageous in that, since its configuration is simplified, its manufacture can be facilitated and absorption performance can be easily adjusted, and in that, when it is constructed in multiple layers, multi-band absorption characteristics can be obtained. However, such a Salisbury screen is disadvantageous in that the thickness of the dielectric spacer from the metal conductive ground plane must be more than at least $\lambda/4$.

Therefore, an electromagnetic wave absorber, which can be easily manufactured by a simple process, can easily control an absorption frequency band and the absorption characteristics, and can adjust the thickness thereof, is required.

To implement such a required electromagnetic wave absorber, when the above-mentioned FSS is interposed between the dielectric spacer and the resistive film of a Salisbury screen, the thickness and absorption performance of the electromagnetic wave absorber should be able to be controlled owing to the inherent electromagnetic properties of the FSS.

Consequently, an electromagnetic wave absorber formed in this way has a structure formed by adding a resistive coating to the typical structure of the EBG. Furthermore, when the unit cell patterns of the EBG are designed and made of a resistive material on a metal conductor, such a resistive EBG itself may function as a simpler electromagnetic wave absorber. Such an electromagnetic wave absorber may be applied to fields where existing electromagnetic wave absorbers have been applied in order to reduce the multiple reflection of electromagnetic waves, as a simpler structure that is easily manufactured and has low cost. In particular, since the absorption frequency band of the electromagnetic wave absorber can be adjusted only by a simple structural or material deformation of the unit cell thereof, the electromagnetic wave absorber can selectively absorb the electromagnetic waves of a desired frequency band, so that this electromagnetic wave absorber can be very usefully used under the condition that electromagnetic waves of various frequency bands coexist.

However, when such an electromagnetic wave absorber is actually provided and used, since the resistive pattern layer, the dielectric layer and a metal conductor layer of the EBG are not transparent because they have inherent colors, respectively, the usage of this electromagnetic wave absorber is considerably restricted at a space where a light needs to be transmitted or at a place where a view needs to be secured. It goes without saying that a transparent electromagnetic wave absorber can be utilized in a further variety of spaces for even more different purposes. For example, when an electromagnetic wave absorber has an ability to absorb electromagnetic waves of a desired frequency band while maintaining transparency like a windowpane, it can be provided in windowpanes of facilities, such as general houses, libraries, schools, offices and hospitals, to block undesired electromagnetic waves incoming through the windowpanes, so that it can protect the human body and appliances in the facilities. However, in order to utilize a conventional transparent electromagnetic wave absorber as a windowpane, the electromagnetic wave absorber needs to be manufactured into a new windowpane due to its structure, and thus there is a disadvantage in that a previously provided windowpane cannot be utilized.

SUMMARY OF THE INVENTION

In view of the above, the present invention provides an electromagnetic wave absorbing device which can be easily manufactured by using a periodic structure such as an electromagnetic bandgap (EBG) and a transparent resistive material, can easily adjust its absorption frequency band and absorption characteristics by changing parameters, can be miniaturized by adjusting its thickness, and can implement a resistive pattern layer, a metal conductor layer and a dielectric layer with a transparent material to thereby make itself transparent.

Further, the present invention provides an electromagnetic wave absorbing device which can suitably adjust the phase and loss between transmitted waves and reflected waves by a combination of a resistive pattern layer formed of periodic arrangement of unit cells, a dielectric layer and a metal conductor layer, by employing a periodic structure such as an EBG, thereby selectively absorbing only electromagnetic waves of a desired frequency band.

Here, the dielectric layer may be made of a transparent material such as glass, and the resistive pattern layer and the metal conductor layer may be made of a transparent material such as a transparent electrode material.

Further, the present invention provides an electromagnetic wave absorbing device, which can use existing facilities such as a windowpane, a glass door and the like while maintaining their transparency, and which can absorb or block electromagnetic waves of a desired frequency band.

In accordance with a first aspect of the present invention, there is provided an electromagnetic wave absorbing device, including: a ground layer formed of a metal conductor layer; a dielectric layer formed on the ground layer; and a unit cell pattern layer which is formed on the dielectric layer and in which at least two unit cell patterns made of a resistive material are periodically arranged.

In accordance with a second aspect of the present invention, there is provided an electromagnetic wave absorbing device, including: a ground layer which is a metal conductor layer and is made of a transparent electrode material; a dielectric layer formed on the ground layer and made of a transparent glass material; and a unit cell pattern layer which is formed on the dielectric layer and made of a transparent electrode material and in which at least two electromagnetic bandgap-based unit cell patterns made of a resistive material are periodically arranged.

In accordance with a third aspect of the present invention, there is provided a device for absorbing electromagnetic waves, including:
a ground layer which is a metal conductor layer and is made of a transparent electrode material;
a dielectric layer formed on the ground layer and made of a transparent glass material; and
a unit cell pattern layer which is formed on the dielectric layer and made of a transparent electrode material and in which at least two unit cell patterns made of a resistive material are periodically arranged,
wherein the unit cell pattern includes:
a central unit cell pattern having a shape of a regular tetragon, a center of each side of which has a rectangularly shaped recess; and
peripheral unit cell patterns configured to be coupled with a center of each side of the central unit cell pattern while having a regular interval therebetween.

In accordance with a fourth aspect of the present invention, there is provided a device for absorbing electromagnetic waves, including:
a ground layer which is a metal conductor layer and is made of a transparent electrode material;
a dielectric layer formed on the ground layer and made of a transparent glass material; and
a unit cell pattern layer which is formed on the dielectric layer and made of a transparent electrode material and in which at least two unit cell patterns made of a resistive material are periodically arranged,
wherein the unit cell pattern includes:
a central unit cell pattern having a shape of a regular tetragon, a center of each side of which has a rectangularly shaped recess; and
peripheral unit cell patterns configured to be coupled with a center of each side of the central unit cell pattern while having a regular interval therebetween,
wherein the central unit cell pattern has a slot formed at a center thereof.

In accordance with a fifth aspect of the present invention, there is provided a device for absorbing electromagnetic waves, including:
a ground layer which is a metal conductor layer and is made of a transparent electrode material;
a dielectric layer formed on the ground layer and made of a transparent glass material; and
a unit cell pattern layer which is formed on the dielectric layer and made of a transparent electrode material and in which at least two unit cell patterns made of a resistive material are periodically arranged,
wherein the unit cell pattern includes:
a central unit cell pattern having a shape of a regular tetragon, a center of each side of which has a rectangularly shaped recess; and
peripheral unit cell patterns configured to be coupled with a center of each side of the central unit cell pattern while having a regular interval therebetween,
wherein the central unit cell pattern has a first slot formed at a center thereof and second slots, each having a regular tetragonal shape, formed at respective edges of the first slot.

In accordance with a sixth aspect of the present invention, there is provided a device for absorbing electromagnetic waves, including:
a ground layer which is a metal conductor layer and is made of a transparent electrode material;

a dielectric layer formed on the ground layer and made of a transparent glass material; and a unit cell pattern layer which is formed on the dielectric layer and made of a transparent electrode material and in which at least two unit cell patterns made of a resistive material are periodically arranged, wherein the unit cell pattern includes:

a central unit cell pattern having a shape of a regular tetragon, a center of each side of which has a rectangularly shaped recess; and peripheral unit cell patterns configured to be coupled with a center of each side of the central unit cell pattern while having a regular interval therebetween, wherein the central unit cell pattern has a first slot formed at a center thereof and second slots, each having a regular tetragonal shape, formed at respective edges of the first slot, and each of the peripheral unit cell patterns has a third slot having the same shape as the peripheral unit cell pattern at a center of the peripheral unit cell pattern.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

The objects, features and advantages of the present invention will be more clearly understood from the following detailed description and embodiments taken in conjunction with the accompanying drawings. In the following description of the present invention, if the detailed description of the already known structure and operation may confuse the subject matter of the present invention, the detailed description thereof will be omitted. The following terms are terminologies defined by considering functions in the embodiments of the present invention and may be changed operators intend for the invention and practice. Hence, the terms should be defined throughout the description of the present invention. Throughout the accompanying drawings, the same reference numerals are used to designate the same or similar components, and redundant descriptions thereof are omitted.

Hereinafter, embodiments of the present invention will be described with reference to the accompanying drawings which form a part hereof.

Figure 1:
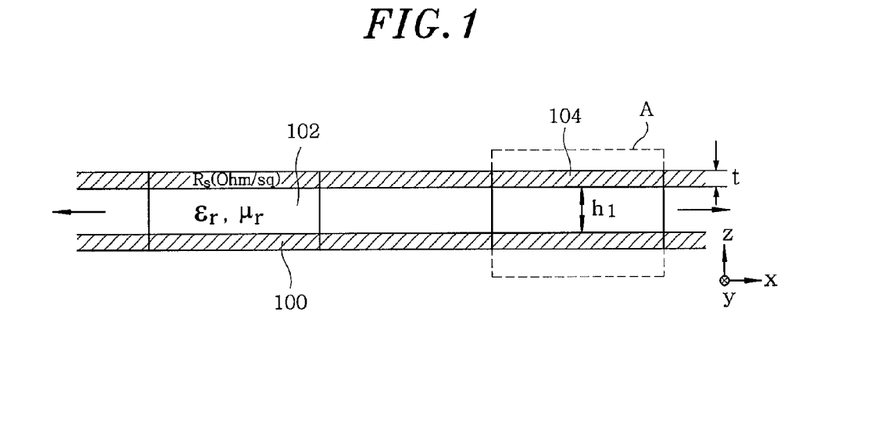
FIG. 1 is a sectional view showing an electromagnetic wave absorbing device in accordance with an embodiment of the present invention.

FIG. 1 is a sectional view of an electromagnetic wave absorbing device in accordance with an embodiment of the present invention.

Referring to FIG. 1, the electromagnetic wave absorbing device has a structure in which EBG unit cells 'A' are periodically arranged. Each of the unit cells 'A' includes a ground layer 100 formed of a metal conductor layer, a dielectric layer 102 formed on the ground layer 100, and a unit cell pattern 104 made of a resistive material and formed on the dielectric layer 102.

The ground layer 100 may be made of a transparent electrode material, such as indium tin oxide (hereinafter, referred to as ITO), carbon nanotubes (hereinafter, referred to as CNT) or the like, and totally reflects the electromagnetic waves that have been partially transmitted through the unit cell pattern 104.

The dielectric layer 102 may be made of a transparent material, for example, transparent glass.

The unit cell pattern 104 made of a resistive material, which is a resistive EBG unit cell pattern, may be made of a transparent electrode material such as ITO, CNT or the like, similarly to the ground layer 100.

On this wise, since the ground layer 100, the dielectric layer 102 and the unit cell pattern 104 constituting the unit cell 'A' can be made of a transparent material, a transparent electromagnetic wave absorbing device can be acquired. Accordingly, the transparent electromagnetic wave absorbing device having such a simple structure can be applied to an existing windowpane, while having a function of absorbing and blocking electromagnetic waves. In detail, the existing windowpane is used as the dielectric layer 102 of the present invention and both sides thereof are provided with the transparent ground layer 100 and the transparent unit cell pattern 104, thereby creating a windowpane having a function of absorbing and blocking electromagnetic waves without providing a newly manufactured windowpane.

The unit cell pattern 104 has a structure of incorporating loss into a frequency selective surface (FSS), and partially reflects or partially transmits incident waves at a desired frequency and adjusts a phase within a dielectric.

Since the ground layer 100 totally reflects the electromagnetic waves partially transmitted through the unit cell pattern 104 made of a resistive material and consequently a structure of EBG is formed, an absorption frequency is determined by capacitance and inductance which are designed by the unit cell pattern 104 from a height of the dielectric layer 102, and the height of the dielectric layer 102 becomes much smaller than λ/4, which is a height necessary to absorb electromagnetic waves, due to the reflection phase characteristics of the surface of an EBG. As a result, the electromagnetic waves partially transmitted through the unit cell pattern 104 may be attenuated.

A height '$h_1$' from the ground layer 100 to the unit cell pattern 104, dielectric characteristics '$\in_r$', '$\mu_r$' of the dielectric layer 102 and a thickness 't' of the unit cell pattern 104 act as parameters for determining electromagnetic wave absorption performance, thus adjusting an absorption band and an absorption performance of the electromagnetic waves. Here, the same parameters of each direction can have different values in each direction, and in this case, the electromagnetic waves of different frequency bands from each other can be simultaneously absorbed in both directions.

Figure 2:
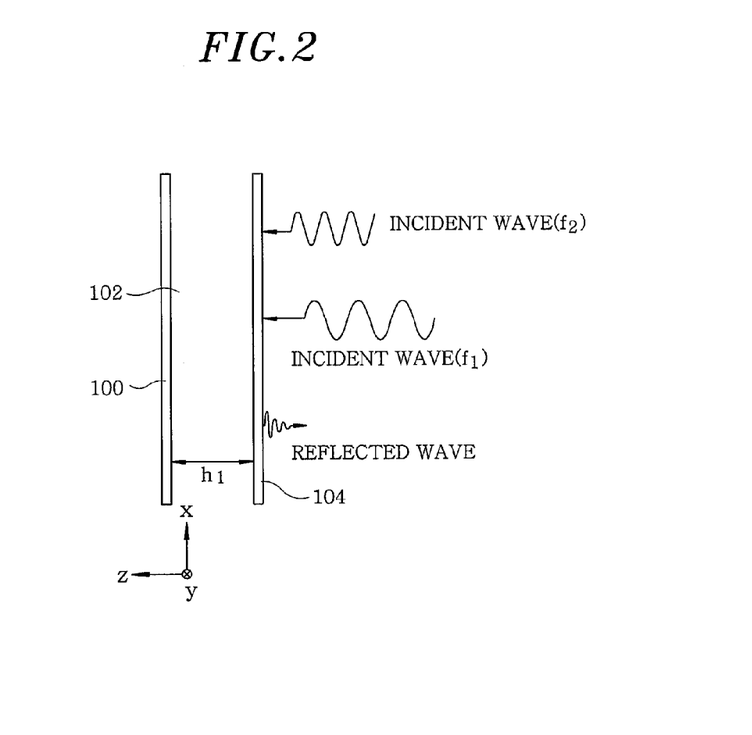
FIG. 2 is a conceptual view for explaining the electromagnetic wave absorption principle of an electromagnetic wave absorbing device in accordance with the embodiment of the present invention.

FIG. 2 is a conceptual view for explaining the electromagnetic wave absorption principle of the electromagnetic wave absorbing device in accordance with the embodiment of the present invention.

As shown in FIG. 2, when incident waves $f_1$ and $f_2$ of several frequency bands reach the electromagnetic wave absorbing device, the electromagnetic wave absorbing device hardly allows reflected waves to exist, thus increasing the electromagnetic wave absorption performance thereof.

Figure 3A:
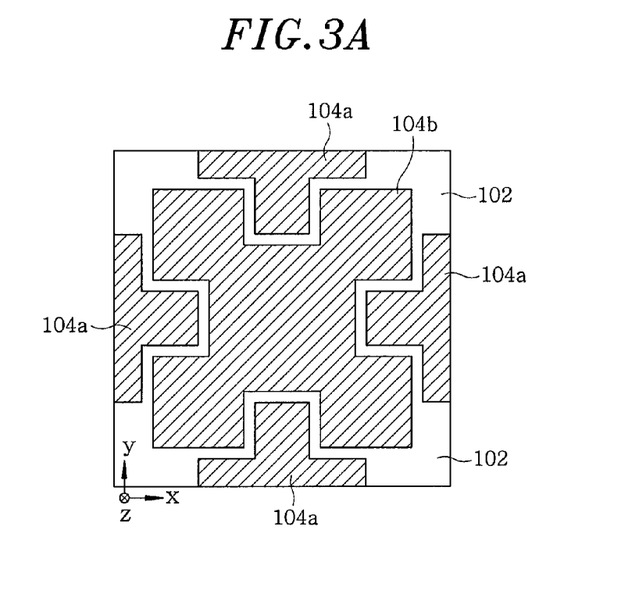
FIGS. 3A and 3B show plan views of an electromagnetic wave absorbing device having a first unit cell pattern in accordance with the embodiment of the present invention.
Figure 3B:
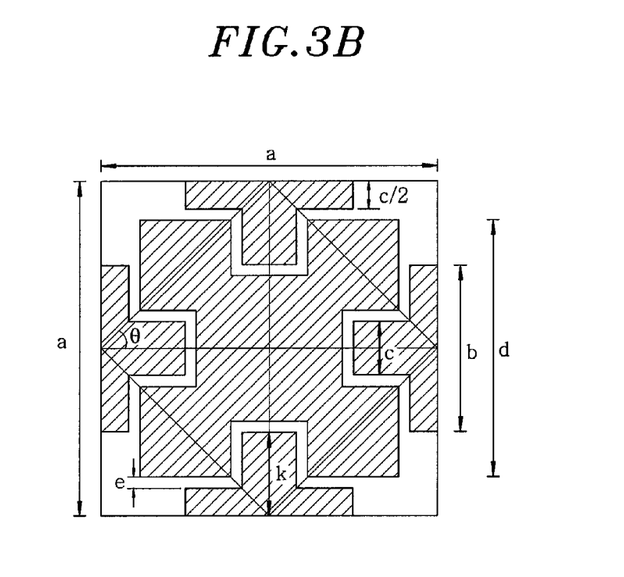

FIGS. 3A and 3B show plan views of the electromagnetic wave absorbing device having a first unit cell pattern formed on a dielectric layer in accordance with the embodiment of the present invention.

Concretely, FIG. 3A is a plan view illustrating a first unit cell pattern structure for EBG applicable to the present invention, and FIG. 3B is a plan view illustrating detailed design parameters of the first unit cell pattern structure shown in FIG. 3A.

Referring to FIG. 3A, the first unit cell pattern structure includes peripheral unit cell patterns 104a and a central unit cell pattern 104b.

The central unit cell pattern 104b, which is a basic patch disposed at the center of the first unit cell pattern, has a shape of a regular tetragon, the center of each side of which has a rectangularly shaped recess.

Each of the peripheral unit cell patterns 104a is a semi-orthogonal dipole patch, and is configured to be coupled with the center of each side of the central unit cell pattern 104b while having a regular interval therebetween.

Here, the central unit cell pattern 104b and the peripheral unit cell patterns 104a are made of a transparent electrode material such as ITO, CNT or the like, as described above. The transparent electrode material is characterized in that it has electroconductivity because its surface resistance is about 1000 Ohm/sq or less and in that it has a transmissivity of about 80% or more in the visible light range of 380~780 nm. When the surface resistance of the transparent electrode material becomes extremely small, the electroconductivity thereof becomes large, and thus the properties of the transparent electrode material can approximate those of metal.

Referring to FIG. 3B, a parameter 'a' indicates a length of one side of the first unit cell pattern; a parameter 'b' indicates a length of one side of the peripheral unit cell pattern 104a coming into contact with one side of the first unit cell pattern; a parameter 'c' indicates a length of the inner side among the sides of the peripheral unit cell pattern 104a being coupled with the central unit cell pattern 104b; a parameter 'd' indicates a length of one side of the regular tetragon of the central unit cell pattern 104b; a parameter 'e' indicates an interval between the central unit cell pattern 104b and the peripheral unit cell pattern 104a; and a parameter 'k' indicates a vertical height of the peripheral unit cell pattern 104a from one side of the first unit cell pattern.

Figure 4:
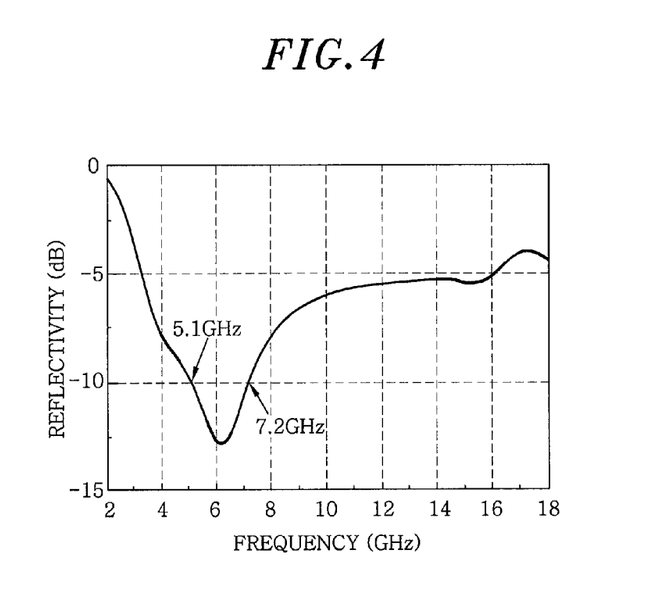
FIG. 4 is a graph illustrating an electromagnetic wave absorption band and electromagnetic wave absorption performance of the electromagnetic wave absorbing device having the first unit cell pattern shown in FIG. 3.

FIG. 4 is a graph illustrating an electromagnetic wave absorption band and an electromagnetic wave absorption performance of the electromagnetic absorbing device having the first unit cell pattern shown in FIGS. 3A and 3B, which was simulated based on parameters having values as follows: Rs=40 Ohm/sq, a=30 mm, b=15 mm, c=5 mm, d=23 mm, e=1 mm, $h_1$=5 mm, k=7.5 mm, t=0.001 mm, θ=45°, $\in_r$=1, and $\mu_r$=1. These parameters are shown in FIG. 1 and FIG. 3B and can be used to determine an electrical length between the central unit cell pattern 104b and the peripheral unit cell pattern 104a.

In this case, a reflectivity indicating absorption performance is represented by the following Equation 1.

$$R(dB) = 20 \times \log(r_{DUT}/r_G)$$ Equation 1

Here, R is a reflectivity, $r_{DUT}$ is a reflection coefficient of the electromagnetic wave absorbing device, and $r_G$ is a reflection coefficient of a surface of a metal conductor layer.

In the embodiment of the present invention, the absorption frequency band of electromagnetic waves can be determined on a basis of −10 dB. The reflectivity of −10 dB means that 90% of incident electromagnetic waves are absorbed. Since a frequency band that has a reflectivity of −10 dB or less is from 5.1 GHz to 7.2 GHz, the frequency band in the embodiment is from 5.1 GHz to 7.2 GHz.

Therefore, the resonance frequency and bandwidth of the electromagnetic wave absorbing device can be controlled by adjusting the parameters that determine the electrical length between the central unit cell pattern 104b and the peripheral unit cell pattern 104a, a height from the ground layer 100 to the first unit cell pattern, material properties of the dielectric layer 102, a surface resistance of the first unit cell pattern, and/or the like.

In FIG. 4, various materials may be used as the dielectric. Particularly, as proposed in the embodiment of the present invention, transparent glass may be used as the dielectric. Generally, it is known that the dielectric constant $\in_r$ of glass is much greater than that of air and it is possible to fabricate glass having a dielectric constant of about 10. Such a dielectric constant is one of the parameters controlling electromagnetic wave absorption performance, and thus the absorption frequency band and the absorption bandwidth can be changed by fabricating dielectric layer 102 with the dielectric constant changed.

Figure 5:
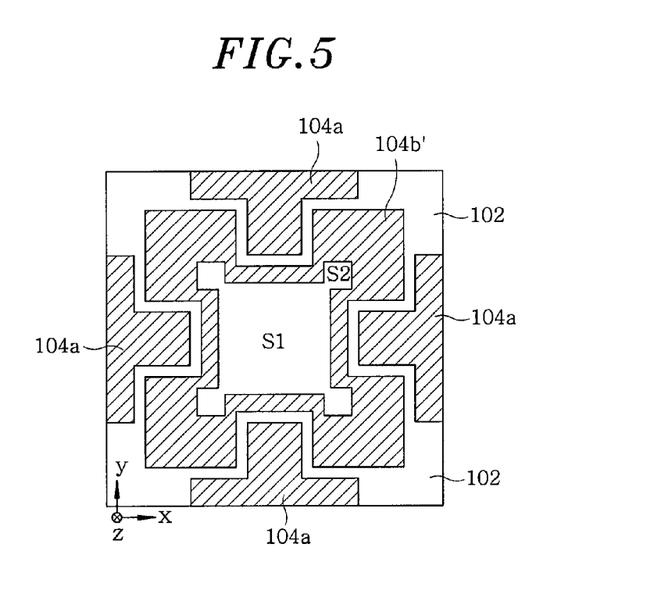
FIG. 5 is a plan view showing an electromagnetic wave absorbing device having a second unit cell pattern in accordance with the embodiment of the present invention.

FIG. 5 is a plan view showing an electromagnetic wave absorbing device having a second unit cell pattern in accordance with the embodiment of the present invention.

As shown in FIG. 5, the second unit cell pattern includes peripheral unit cell patterns 104a and a central unit cell pattern 104b'.

The central unit cell pattern 104b', which is a basic patch disposed at the center of the second unit cell pattern, has a shape of a regular tetragon, the center of each side of which has a rectangularly shaped recess.

Further, each of the peripheral unit cell patterns 104a is a semi-orthogonal dipole patch, and is configured to be coupled with the center of each side of the central unit cell pattern 104b' while having a regular interval therebetween.

When the central unit cell pattern 104b' is compared to the central unit cell pattern 104b of the first unit cell pattern of FIG. 3, this central unit cell pattern 104b' is different from the central unit cell pattern 104b in that a slot S1 is formed at the center of the central unit cell pattern 104b' and slots S2, each having a regular tetragonal shape, are formed at the edges of the slot S1.

In this case, the resonance frequency and bandwidth of the electromagnetic wave absorbing device can be controlled by adjusting parameters determining the electrical length between the central unit cell pattern 104b' and the peripheral unit cell pattern 104a, a height from the ground layer 100 to the second unit cell pattern, material properties of the dielectric layer 102, a surface resistance of the second unit cell pattern, a size of the slot S1, a length of one side of each of the slots S2 and/or the like. For example, the absorption bandwidth of the electromagnetic wave absorbing device can be enlarged and the maximum absorption frequency can be set higher, by adjusting sizes of the slot S1 and the slots S2.

Here, the above parameters may include: a length of one side of the second unit cell pattern; a length of one side of the peripheral unit cell pattern 104a coming into contact with one side of the second unit cell pattern; a length of the inner side among the sides of the peripheral unit cell pattern 104a being coupled with the central unit cell pattern 104b'; a length of one side of the regular tetragon of the central unit cell pattern 104b'; an interval between the central unit cell pattern 104b' and the peripheral unit cell pattern 104a; and a vertical height of the peripheral unit cell pattern 104a from one side of the second unit cell pattern.

Further, a surface resistance value of the central unit cell pattern 104b' may be different from that of the peripheral unit cell pattern 104a, periodically-arranged second unit cell patterns adjacent to each other may have different surface resistance values from each other, and the periodically-arranged second unit cell patterns adjacent to each other may be alternately disposed such that one or more of the unit cell structures and the unit cell surface resistance values are different from each other.

Figure 6:
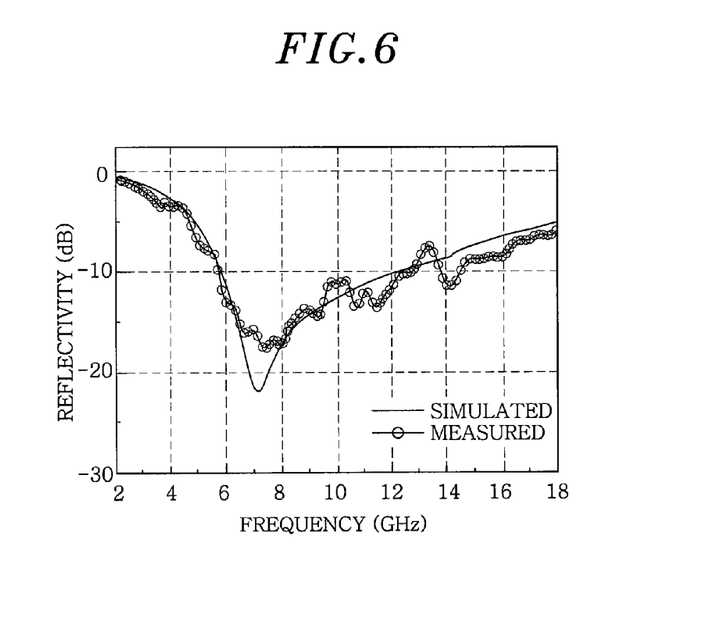
FIG. 6 is a graph illustrating simulated values and measured values of an electromagnetic wave absorption band and electromagnetic wave absorption performance of the electromagnetic wave absorbing device having the second unit cell pattern shown in FIG. 5.

FIG. 6 is a graph illustrating simulated values and measured values of the electromagnetic wave absorption band and electromagnetic wave absorption performance of the electromagnetic wave absorbing device having the second unit cell pattern shown in FIG. 5.

As shown in FIG. 6, it can be seen that the electromagnetic wave absorbing device is actually operated such that its real values are almost equal to the simulated values. Further, it can be ascertained that, compared to the predicted results shown in FIG. 4, its maximum absorption frequency was adjusted upward, and thus its absorption bandwidth became larger.

Figure 7:
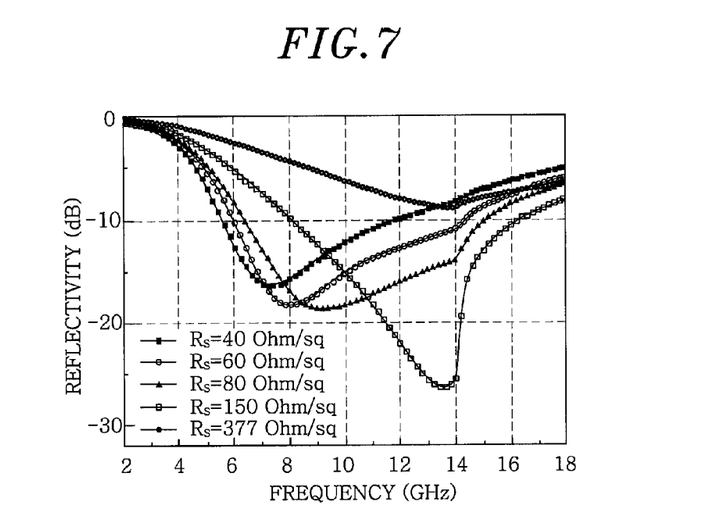
FIG. 7 is a graph showing results of electromagnetic wave absorption performance, which was simulated while changing a surface resistance value of the second unit cell pattern of the electromagnetic wave absorbing device shown in FIG. 5.

FIG. 7 is a graph showing electromagnetic wave absorption performance, which was simulated while changing a surface resistance value Rs of the second unit cell pattern of the electromagnetic wave absorbing device shown in FIG. 5.

As shown in FIG. 7, it can be ascertained that a maximum absorption frequency and absorption bandwidth of the electromagnetic wave absorbing device can be greatly adjusted by changing the surface resistance Rs of the unit cell pattern. According to recent transparent electrode technologies, it is possible to realize a transparent electrode material having a light transmittance of about 80% or more at a surface resistance of 1000 Ohm/sq or less and having excellent electroconductivity, so that the unit cell pattern having a surface resistance shown in this embodiment can be easily materialized with the transparent electrode material.

Figure 8:
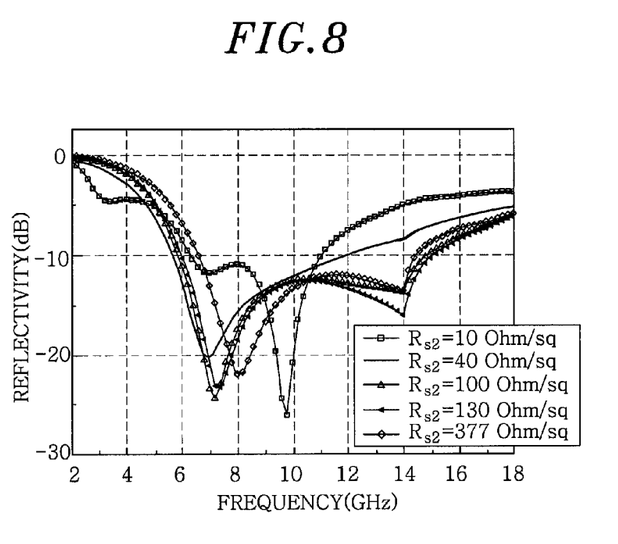
FIG. 8 is a graph showing results of electromagnetic wave absorption performance, which was simulated while fixing a surface resistance of a central unit cell pattern of the electromagnetic wave absorbing device shown in FIG. 5 at 40 Ohm/sq and changing a surface resistance of peripheral unit cell patterns thereof.

FIG. 8 is a graph showing electromagnetic wave absorption performance, which was simulated while fixing a surface resistance Rs1 of the central unit cell pattern 104b' of the electromagnetic wave absorbing device shown in FIG. 5 at 40 Ohm/sq and changing a surface resistance Rs2 of the peripheral unit cell patterns 104a.

From FIG. 8, it can be seen that the absorption bandwidth thereof is greatly improved when the surface resistance Rs2 is more than 40 Ohm/sq.

Figure 9:
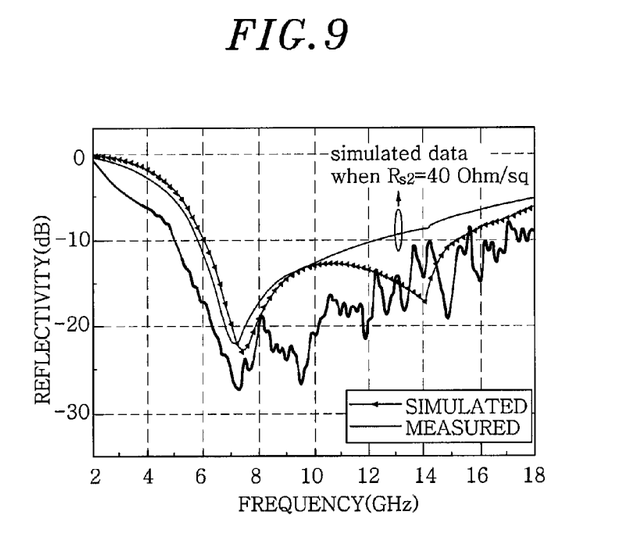
FIG. 9 is a graph comparing a result of electromagnetic wave absorption performance which was measured when the surface resistance of the peripheral unit cell patterns of the electromagnetic wave absorbing device shown in FIG. 5 is set to be 130 Ohm/sq, to a corresponding simulated result thereof shown in FIG. 8.

FIG. 9 is a graph comparing a result of electromagnetic wave absorption performance, which was measured when the surface resistance Rs2 of the peripheral unit cell patterns 104a is set to be 130 Ohm/sq, to a corresponding simulated result thereof shown in FIG. 8.

From FIG. 9, it can be seen that the improvement in electromagnetic wave absorption performance is achieved similarly to the simulated result, and the measured result thereof shows a further improvement over the simulated results thereof.

Figure 10:
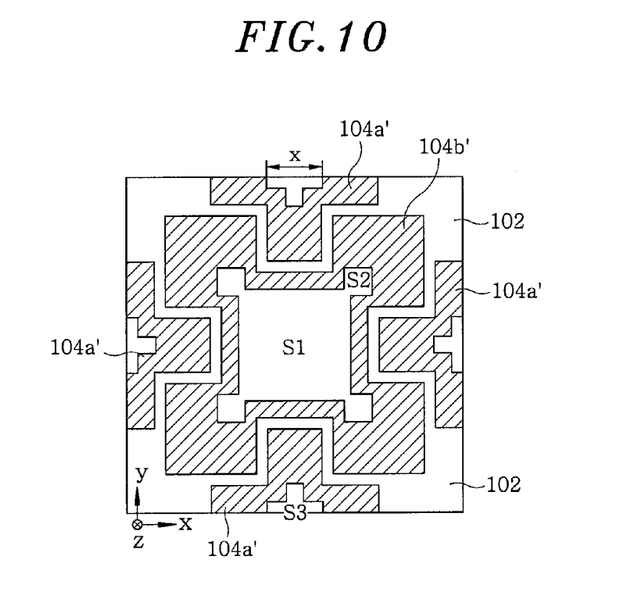
FIG. 10 a plan view showing an electromagnetic wave absorbing device having a third unit cell pattern in accordance with the embodiment of the present invention.

FIG. 10 is a plan view showing an electromagnetic wave absorbing device having a third unit cell pattern in accordance with the embodiment of the present invention.

As shown in FIG. 10, the third unit cell pattern includes peripheral unit cell patterns 104a' and a central unit cell pattern 104b'.

The central unit cell pattern 104b', which is a basic patch disposed at the center of the third unit cell pattern, has a shape of a regular tetragon, the center of each side of which has a rectangularly shaped recess. Further, a slot S1 is formed at the center of the central unit cell pattern 104b' and slots S2, each having a regular tetragonal shape, are formed at the edges of the slot S1, which are the same structure as those shown in FIG. 5.

Further, each of the peripheral unit cell patterns 104a' is a semi-orthogonal dipole patch, and is configured to be coupled with the center of each side of the central unit cell pattern 104b' while having a regular interval therebetween.

The third unit cell pattern is different from the second unit cell pattern of FIG. 5 in that each of the peripheral unit cell patterns 104a' includes a slot S3.

A shape of the slot S3 is the same as that of each of the peripheral unit cell patterns 104a', i.e., the slot S3 has a shape of a semi-orthogonal dipole patch.

In this case, the resonance frequency and bandwidth of the electromagnetic wave absorbing device can be controlled by adjusting the parameters determining the electrical length between the central unit cell pattern 104b' and the peripheral unit cell pattern 104a', a height from the ground layer 100 to the third unit cell pattern, material properties of the dielectric layer 102, the surface resistance of the third unit cell pattern, a size of the slot S1, a length of one side of each of the slots S2, a size of the slot S3, and/or the like. For example, the absorption bandwidth of the electromagnetic wave absorbing device can be enlarged and the maximum absorption frequency can be set higher, by adjusting sizes of the slot S1, the slots S2 and the slots S3.

Here, the above parameters may include: a length of one side of the third unit cell pattern; a length of one side of the peripheral unit cell pattern 104a' coming into contact with one side of the third unit cell pattern; a length of the inner side among the sides of the peripheral unit cell pattern 104a' being coupled with the central unit cell pattern 104b'; a length of one side of the regular tetragon of the central unit cell pattern 104b'; an interval between the central unit cell pattern 104b' and the peripheral unit cell pattern 104a'; and a vertical height of the peripheral unit cell pattern 104a' from one side of the third unit cell pattern.

Further, a surface resistance value of the central unit cell pattern 104b' may be different from that of the peripheral unit cell pattern 104a', periodically-arranged third unit cell patterns adjacent to each other may have different surface resistance values from each other, and the periodically-arranged third unit cell patterns adjacent to each other may be alternately disposed such that one or more of unit cell structures and unit cell surface resistance values are different from each other.

Figure 11:
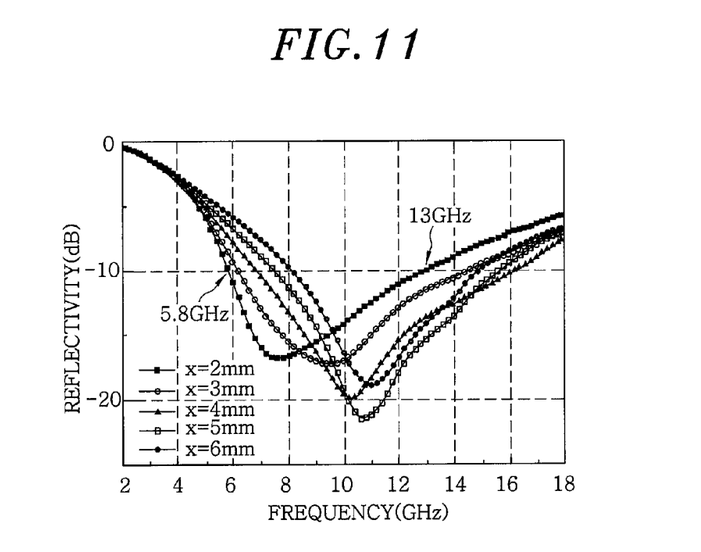
FIG. 11 is a graph showing results of the electromagnetic wave absorption performance, which was simulated while changing a length of one side of a slot S3 of a peripheral unit cell pattern in the third unit cell pattern of the electromagnetic wave absorption device shown in FIG. 10.

FIG. 11 is a graph showing electromagnetic wave absorption performance, which was simulated while changing a length 'x' of one side of a slot S3 of the peripheral unit cell pattern 104a' in the third unit cell pattern of the electromagnetic wave absorption device of FIG. 10.

Similarly, from FIG. 11, it can be ascertained that the electromagnetic wave absorption performance can be easily controlled by adjusting the physical parameters.

Figure 12:
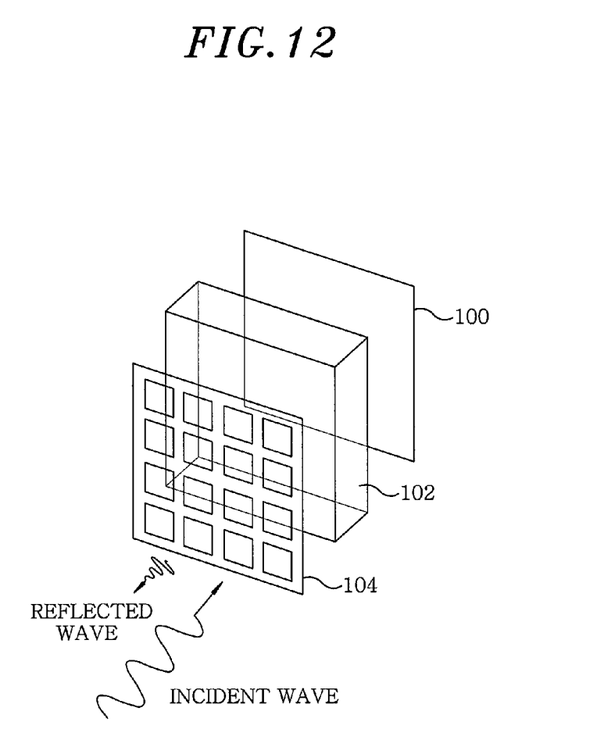
FIG. 12 is a schematic view illustrating a method of applying the electromagnetic wave absorbing device of the present invention to a windowpane.

FIG. 12 is a schematic view illustrating a method of applying the electromagnetic wave absorbing device of the present invention to a windowpane.

When the electromagnetic wave absorbing device is attached to both sides of the existing windowpane, the windowpane can have the function of absorbing and blocking desired electromagnetic waves while maintaining its own function.

That is, when the ground layer 100 which is transparent metal conductor layer and the unit cell pattern 104 which is transparent EBG pattern layer are attached to both sides of the existing windowpane 102, the windowpane 102 can maintain its own functionality, i.e., transparency and can have the additional function of absorbing and blocking electromagnetic waves of a desired frequency band.

As described above, in accordance with the embodiment of the present invention, the electromagnetic wave absorption performance (absorption bandwidth and maximum absorption frequency) of the electromagnetic wave absorbing device can be easily adjusted by simply changing physical parameters and electrical parameters of the unit cell structures. The unit cell structures having electromagnetic wave absorption performance, which are basic unit cell structures of the electromagnetic wave absorbing device of the present invention fabricated based on a periodical structure, can selectively and simultaneously absorb electromagnetic waves of different frequency bands. Further, since the transparency of the electromagnetic wave absorbing device of the present invention is 80% or more, it can be used in various fields while maintaining an electromagnetic wave absorption performance equal to or greater than that of conventional electromagnetic wave absorbing devices, and thus its industrial effect is very great. In particular, as described above, when the electromagnetic wave absorbing device of the present invention is applied to a windowpane, it can be directly applied to existing windowpanes in lieu of the conventional problem of the existing windowpane not being able to be used, so that the costs of fabricating and providing a new windowpane can be reduced, thereby increasing its effect in the field of architecture.

According to the present invention, since an electromagnetic wave absorbing device is realized by applying a periodical structure such as an EBG, when this electromagnetic wave absorbing device is installed in a desired location, it can selectively absorb electromagnetic waves of targeted frequency bands, and its application range can be enlarged by making it transparent using a transparent electrode. For example, when this electromagnetic wave absorbing device is installed in buildings, such as houses, libraries, schools, offices and hospitals, as an alternative to a windowpane, it can effectively absorb electromagnetic waves for the convenience of users while allowing a windowpane to continue carrying out its own natural functions, so that users can overcome the direct and indirect negative influences of electromagnetic waves.

Further, since a structure of the electromagnetic wave absorbing device is simple, it can be easily fabricated as a new windowpane. Also, the electromagnetic wave absorbing device can be simply applied to an existing windowpane by attaching its transparent metal conductor layer and transparent EBG pattern layer to both sides of the existing windowpane, thereby fully reducing the cost of fabricating and providing a new windowpane for absorbing electromagnetic waves. Accordingly, the electromagnetic wave absorbing device of the present invention can sufficiently satisfy the requirements of users pursuing a healthy environment, thus exerting a great influence on various industrial fields.

While the invention has been shown and described with respect to the embodiments, it will be understood by those skilled in the art that various changes and modification may be made without departing from the scope of the invention as defined in the following claims.

What is claimed is:

1. An electromagnetic wave absorbing device, comprising:
   a ground layer consisting of a transparent metallic electrode material;
   a dielectric layer disposed on the ground layer; and
   a unit cell pattern layer disposed on the dielectric layer such that at least two unit cell patterns, each comprising a resistive material, are periodically arranged.

2. An electromagnetic wave absorbing device, comprising:
   a ground layer consisting of a transparent metallic electrode material;
   a dielectric layer disposed on the ground layer, the dielectric layer comprising a transparent glass material; and
   a unit cell pattern layer disposed on the dielectric layer such that at least two electromagnetic bandgap-based unit cell patterns, each comprising a resistive material, are periodically arranged, the unit cell pattern layer consisting of the transparent metallic electrode material.

3. The electromagnetic wave absorbing device of claim 1, wherein the unit cell pattern comprises:
   a central unit cell pattern comprising a shape of a regular tetragon, a center of each side comprises a rectangularly shaped recess; and
   peripheral unit cell patterns configured to couple with a center of each side of the central unit cell pattern while comprising a regular interval therebetween.

4. The electromagnetic wave absorbing device of claim 3, wherein a resonance frequency and an absorption bandwidth of the electromagnetic wave absorbing device are controlled by adjusting at least one of a height from the ground layer to the unit cell pattern layer, material properties of the dielectric layer, a surface resistance of the unit cell pattern, and parameters that determine an electrical length between the central unit cell pattern and the peripheral unit cell pattern, or a combination thereof.

5. The electromagnetic wave absorbing device of claim 3, wherein the central unit cell pattern comprises a slot disposed at a center thereof.

6. The electromagnetic wave absorbing device of claim 5, wherein a resonance frequency and an absorption bandwidth of the electromagnetic wave absorbing device are controlled by adjusting at least one of a height from the ground layer to the unit cell pattern layer, material properties of the dielectric layer, a surface resistance of the unit cell pattern, a size of the slot, and parameters that determine an electrical length between the central unit cell pattern and the peripheral unit cell pattern, or a combination thereof.

7. The electromagnetic wave absorbing device of claim 3, wherein the central unit cell pattern comprises a first slot disposed at a center thereof and second slots, each comprising a regular tetragonal shape, disposed at respective edges of the first slot.

8. The electromagnetic wave absorbing device of claim 7, wherein a resonance frequency and an absorption bandwidth of the electromagnetic wave absorbing device are controlled by adjusting at least one of a height from the ground layer to the unit cell pattern layer, material properties of the dielectric layer, a surface resistance of the unit cell pattern, a size of the first slot, a length of one side of each of the second slots, and parameters that determine an electrical length between the central unit cell pattern and the peripheral unit cell pattern, or a combination thereof.

9. The electromagnetic wave absorbing device of claim 3, wherein the central unit cell pattern comprises a first slot disposed at a center thereof and second slots, each comprising a regular tetragonal shape, disposed at respective edges of the first slot, and each of the peripheral unit cell patterns comprises a third slot comprising the same shape as the peripheral unit cell pattern at a center of the peripheral unit cell pattern.

10. The electromagnetic wave absorbing device of claim 9, wherein the third slot comprises a shape of a semi-orthogonal dipole patch.

11. The electromagnetic wave absorbing device of claim 9, wherein a resonance frequency and an absorption bandwidth of the electromagnetic wave absorbing device are controlled by adjusting at least one of a height from the ground layer to the unit cell pattern layer, material properties of the dielectric layer, a surface resistance of the unit cell pattern, a size of the first slot, a length of one side of each of the second slots, a size of the third slot, and parameters that determine an electrical length between the central unit cell pattern and the peripheral unit cell pattern, or a combination thereof.

12. The electromagnetic wave absorbing device of claim 3, wherein each of the peripheral unit cell patterns comprises a shape of a semi-orthogonal dipole patch.

13. The electromagnetic wave absorbing device of claim 3, wherein a surface resistance of the peripheral unit cell pattern is different from that of the central unit cell pattern.

14. The electromagnetic wave absorbing device of claim 9, wherein unit cell patterns adjacent to each other among the unit cell patterns comprise surface resistance values different from each other.

15. The electromagnetic wave absorbing device of claim 9, wherein the unit cell patterns are alternately disposed such that a unit cell structure and a unit cell surface resistance value are different from each other.

16. The electromagnetic wave absorbing device of claim 11, wherein the parameters comprise:
   a length of one side of the unit cell pattern;
   a length of one side of the peripheral unit cell pattern coming into contact with one side of the unit cell pattern;
   a length of an inner side among sides of the peripheral unit cell pattern coupled with the central unit cell pattern;
   a length of one side of a regular tetragon of the central unit cell pattern;
   an interval between the central unit cell pattern and the peripheral unit cell pattern; and
   a vertical height of the peripheral unit cell pattern from one side of the unit cell pattern.

17. The electromagnetic wave absorbing device of claim 1, wherein the transparent metallic electrode material is indium tin oxide (ITO).

18. The electromagnetic wave absorbing device of claim 1, wherein a reflectivity of the electromagnetic wave absorbing device is represented by the following Equation:

$$R(\text{dB}) = 20 \times \log(r_{DUT}/r_G)$$

wherein R is the reflectivity of the electromagnetic wave absorbing device, $r_{DUT}$ is a reflection coefficient of the electromagnetic wave absorbing device, and $r_G$ is a reflection coefficient of a surface of the ground layer.

19. The electromagnetic wave absorbing device of claim 9, wherein the electromagnetic wave absorbing device comprises a structure in which the ground layer and the unit cell pattern layer are configured to attach to both sides of the dielectric layer.

20. The electromagnetic wave absorbing device of claim 2, wherein the transparent metallic electrode material is carbon nanotubes (CNTs).

* * * * *